(12) United States Patent
Cherniski

(10) Patent No.: US 6,433,984 B1
(45) Date of Patent: Aug. 13, 2002

(54) LINE FILTER ASSEMBLY FOR MINIMIZING UNWANTED EMISSIONS

(75) Inventor: Andrew M. Cherniski, Rescue, CA (US)

(73) Assignee: Hewlett-Packard Company, Palo Alto, CA (US)

( * ) Notice: Subject to any disclaimer, the term of this patent is extended or adjusted under 35 U.S.C. 154(b) by 0 days.

(21) Appl. No.: 09/540,070

(22) Filed: Mar. 31, 2000

(51) Int. Cl.[7] .................................................. H02H 3/22
(52) U.S. Cl. ....................................................... 361/111
(58) Field of Search ................................. 361/110, 111

(56) References Cited

U.S. PATENT DOCUMENTS

| | | | | |
|---|---|---|---|---|
| 4,616,286 A | * | 10/1986 | Breece | 361/111 |
| 5,142,430 A | * | 8/1992 | Anthony | 361/111 |

* cited by examiner

Primary Examiner—Edward H. Tso
Assistant Examiner—Pia Tibbits

(57) ABSTRACT

A line filter assembly for diverting unwanted emissions generated on a power cord between a power sub-system source and a power grid to ground is disclosed. The line filter assembly includes a PC board having first and second sides. A first pad covered with an electrically conducting material is positioned adjacent to the first side of the PC board. A first electrically conducting brace is an electrical connection with the electrically conducting material covering the first pad. The first electrically conducting brace is also in connection with an enclosure of the line filter assembly. First and second electrically conducting plates are fabricated on the second side of the PC board. The first and second electrically conducting plates are connected to first and second power lines of the power cord, respectively. A dielectric film is positioned adjacent to the first and second electrically conducting plates. A second pad covered with an electrically conducting material is positioned adjacent to the dielectric film. A second electrically conducting brace is in electrically connection with the electrically conducting material covering the second pad and in electrically connection with the enclosure of the line filter assembly.

34 Claims, 5 Drawing Sheets

LINE FILTER ASSEMBLY FOR MINIMIZING UNWANTED EMISSIONS

THE FIELD OF THE INVENTION

The present invention generally relates to power cords in place on electronic systems and instruments, and more particularly to instrument and system designs capable of minimizing unwanted high frequency noise signals.

BACKGROUND OF THE INVENTION

The present invention applies to any electrical or electronic system, such as a computer system. To those skilled in the art of computer hardware technology, it is understood that computer systems include several general components or sub-systems, including a power cord, a line filter, a power source sub-system, and a load sub-system, as such as computer sub-system connected to a power grid.

Electrical systems are required to pass various FCC tests and/or regulations prior to introducing the system to the general public. One particular test of interest is the conducted emissions test, which determines the amount of noise signals conducting on a power cord in the direction toward a power grid from a power source sub-system and a load sub-system. If the noise signals exceed a threshold determined by the FCC for the particular system being tested, the system fails the test. Currently, the conducted emissions test of the FCC tests systems at frequencies between 10 kilohertz and 30 megahertz. Noise signals conducted at frequencies greater than 30 megahertz are not determined, and therefore, not regulated.

A second test of interest is the radiated emissions test, which determines the amount of noise signals radiated from the system including the power cord during operation. If the noise signals radiating from the power cord exceed a threshold determination by the FCC for the particular system being tested, the system fails the test. Currently, the radiated emissions tests of the FCC test systems at frequencies between 30 megahertz and the larger of either one gigahertz or 5 times the maximum system frequency. Noise signals radiated at frequencies outside of this range are not determined, and therefore, not regulated.

As technology advances, the system maximum frequency of electrical systems consistently increases. For example, present and future electrical systems will include maximum system frequencies up to the low gigahertz range. Conventional line filters used in electrical systems to prevent conducted emissions (noise signals) at low range frequencies do not adequately work at these elevated frequency ranges, and tend to permit radiated noise signals from the power cord.

Conventional line filter designs do not adequately work at elevated frequencies due to impedance elements (e.g., capacitors and inductors) that typically have various parasitic components associated with them. For example, at low range frequencies, an inductor has parasitic capacitances which do not significantly impact the amount of noise signals radiated from a particular system. Conversely, at elevated frequency ranges, the parasitic capacitances act as coupling devices which circumvent the effects of the inductor. The purpose of an inductor is to provide a high-impedance, low-conductance path for high-frequency emissions. However, the parasitic capacitances provide a high frequency path through the inductor, which is opposite of a desired effect of an inductor, which is to provide a high impedance, low conductance path for high frequency emissions. Thus, at elevated frequencies, an inductor of a conventional line filter design acts more like a capacitor, rather than an inductor.

Similarly, a capacitor of a conventional line filter resembles an inductor at elevated frequencies, rather than a capacitor. More specifically, a capacitor within a conventional line filter design has associated parasitic inductances. The parasitic inductances become the dominant impedance at elevated frequencies. Thus, capacitors which normally channel unwanted emissions to earth ground through an enclosure, instead look like a high impedance path and do not provide the desired path for unwanted radiated emissions to earth ground.

Therefore, a filter system designed to minimize radiated noise signals, simply passes noise signals at elevated frequencies, thereby contributing to an inefficient overall filter system.

Thus, there is a need for a line filter assembly and design which will minimize unwanted noise signals at elevated frequencies, such as at frequencies up to the mid-gigahertz range. The assembly and design must meet this criterion without significant cost or expense. Significant cost or expense would render the assembly and design impractical. It is desirous to provide a system and design which is reliable, inexpensive in its components, and inexpensive to implement.

SUMMARY OF THE INVENTION

The line filter assembly of the present invention comprises a high frequency filter which includes a PC board having first and second sides. A first pad covered with an electrically conducting material is positioned such that the electrically conducting material is adjacent to the first side of the PC board. A first electrically conducting brace is in electrical connection with the electrically conducting material covering the first pad and in electrical connection with an enclosure of the line filter assembly representing earth ground. First and second electrically conducting plates are fabricated on the second side of the PC board. The first electrically conducting plate is indirectly connected to a power line of the power cord, while the second electrically conducting plate is indirectly connected to a second power line of the power cord. A dielectric film is positioned adjacent to the first and second electrically conducting plates. A second pad covered with an electrically conducting material is positioned such that the electrically conducting material is adjacent to the dielectric film. A second electrically conducting brace is an electrical connection with the electrically conducting material covering the second pad and in electrical connection with the enclosure of the line filter assembly.

In another embodiment of the invention, the line filter assembly previously described is used in a larger overall system capable of diverting a wider range of emissions between a power source sub-system and a power grid. A primary filter sub-section is electrically connected to the power source sub-system. A high frequency filter is electrically connected between the primary filter sub-section and a secondary filter sub-section. The secondary filter sub-system is electrically connected to the power grid.

In yet another embodiment, a high frequency common mode ferrite is electrically connected between the primary filter sub-section and the high frequency filter. Further, the first and second pads of the line filter assembly are each formed from a foam rubber pad, while the first and second electrically conducting plates are each formed from a sheet of copper.

In still yet another embodiment, the first electrically conducting brace further comprises a substantially L-shaped metal brace. Further, the dielectric film of the line filter assembly is fabricated from a Mylar® film, while the PC board is formed from a fiberglass composition. Additionally, the PC board has a capacitance in the range of 5–25 picofarrads per square inch, while the dielectric film has a capacitance in the range of 25–100 picofarrads per square inch.

The present invention is a simply (easy to assembly) design utilizing inexpensive components to minimize unwanted noise signals radiated on a power cord at elevated frequencies. The present invention modifies a conventional design for minimizing unwanted noise signals at low frequencies such that unwanted noise signals at any frequency into the mid-gigahertz range is transmitted to ground.

DESCRIPTION OF THE PREFERRED EMBODIMENTS

In the following detailed description of the preferred embodiments, reference is made to the accompanying drawings which form a part hereof, and in which is shown by way of illustration specific embodiments in which the invention may be practiced. It is to be understood that other embodiments may be utilized and structural or logical changes may be made without departing from the scope of the present invention. The following detailed description, therefore, is not to be taken in a limiting sense, and the scope of the present invention is defined by the appended claims.

The present invention applies to any electrical or electronic system or instrument. However, for clarity sake, the present application will specifically address a computer system. The present invention addresses the issue of minimizing unwanted noise signals transmitted on a power cord between a power source sub-system and a power grid at frequencies up to the mid-gigahertz range.

Figure 1:
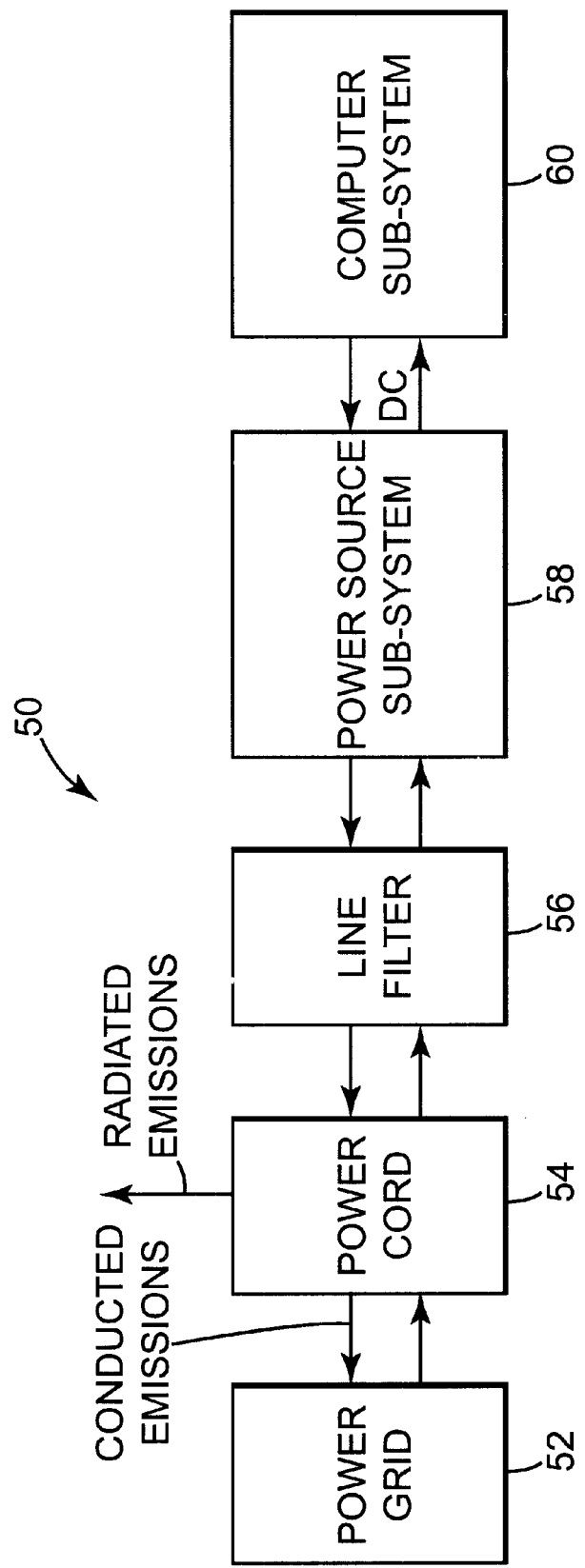
FIG. 1 is a block diagram illustrating an electrical system, such as a computer system.

FIG. 1 is a block diagram illustrating electrical system 50. Electrical system 50 includes power grid 52, power cord 54, line filter 56, power source sub-system 58, and computer sub-system 60. A power path illustrated by arrows traveling from power grid 52 to computer sub-system 60 (arrows travelling from left to right in FIG. 1) represents the power path in system 50. In most conventional systems, 60 hertz of power is transmitted from power grid 52 to power source sub-system 58 after which DC power is supplied to computer subsystem 60. System 50 also illustrates the path of noise signals transmitted from computer sub-system 60 and power source sub-system 58 back towards power grid 52. Conducted emissions are emissions which are conducted along power lines between computer sub-system 60 and power grid 52, while radiated emissions represent emissions radiated from power cord 54. Noise signals conducted along power cord 54 are normally transmitted at frequency ranges between approximately 10 kilohertz and 30 megahertz, while noise signals radiated from power cord 54 are normally transmitted at frequencies greater than approximately 30 megahertz.

Figure 2:
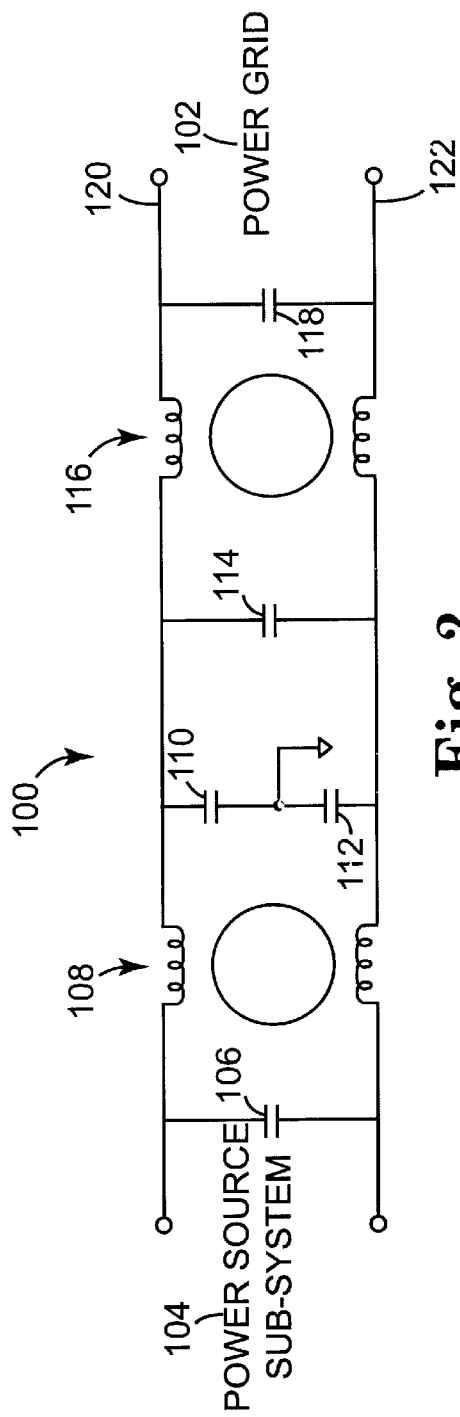
FIGS. 2 and 3 are schematic electrical representations of two prior art embodiments used to minimize unwanted emissions transmitted on a power cord.

FIG. 2 is a schematic electrical representation of prior art line filter assembly 100 used to minimize unwanted noise signal (emissions) conducted on a power cord between power source sub-system 104 and power grid 102 at low range frequencies, such as between approximately 10 kilohertz and 30 megahertz. Line filter assembly 100 includes capacitor 106, common mode inductor 108, capacitors 110, 112, and 114, common mode inductor 116, and capacitor 118. Line filter assembly 100 filters unwanted noise signals otherwise conducted to power grid 102.

Under federal regulations governed by the FCC, electrical systems are subject to conducted emissions tests which determine the level of unwanted emissions conducted on the power lines at frequencies in the range of approximately 10 kilohertz to 30 megahertz. Also, under federal regulations governed by the FCC, electrical systems are subject to radiated emissions tests which determine the level of unwanted emissions radiating from systems including the power lines at frequencies in the range of approximately 30 megahertz to 1 gigahertz or five times the maximum system frequency of the electrical system, which ever is greater.

Prior art line filter assembly 100 provides a path for unwanted noise signals conducted at lower frequencies, such as in the range of approximately 10 kilohertz to 30 megahertz, to earth ground. However, at elevated frequencies greater than approximately 30 megahertz, line filter assembly 100 no longer operates as a filter for unwanted radiated noise signals. Rather, line filter assembly 100 provides the opposite effect, acting as an electrical path for unwanted noise signals between power source sub-system 104 and power grid 102, as previously described in the Background of the Invention, thereby degrading the efficiency of the particular system.

However, until recently, this undesired effect at elevated frequencies was not addressed since electrical systems did not include elevated frequency sources. As technology advances, systems utilizing elevated frequencies are becoming more and more common. Thus, those skilled in the art developed a new filter element which diverts unwanted noise signals to earth ground.

Figure 3:
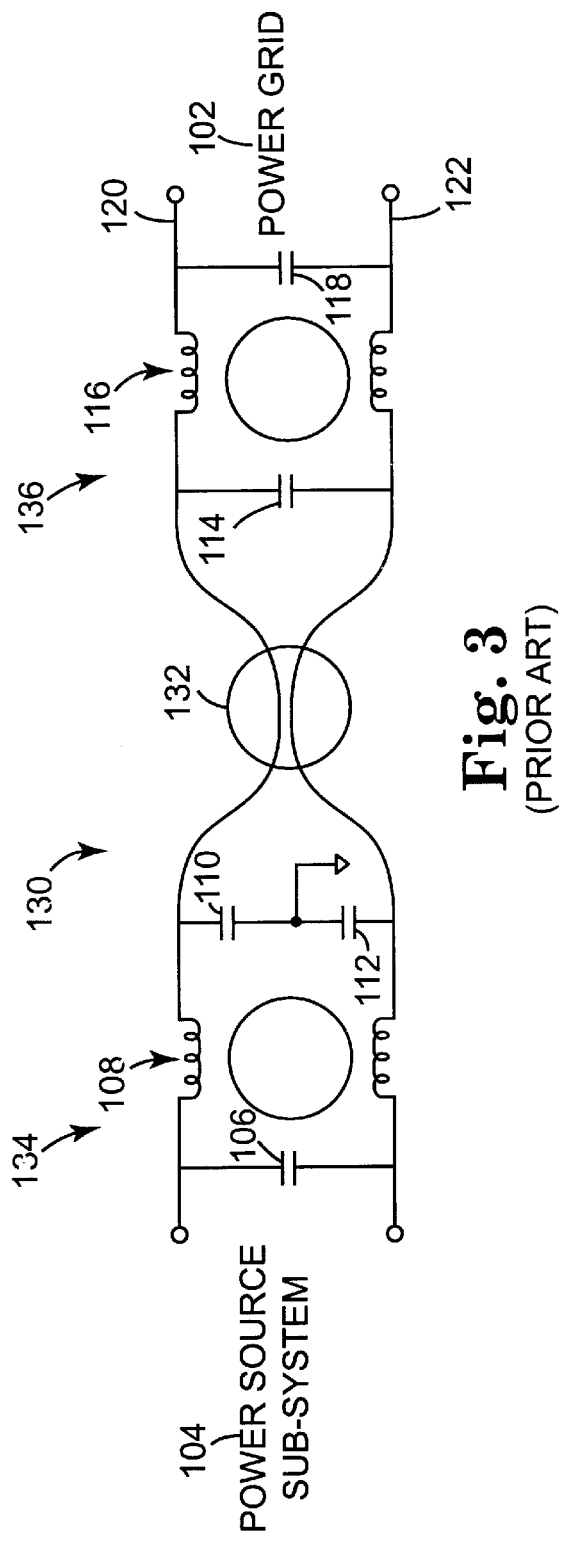

FIG. 3 is a schematic electrical representation of a second prior art embodiment used to minimize unwanted emissions transmitted on a power cord at low and mid-range frequencies. Line filter assembly 130 incorporates the components of line filter assembly 100, shown in FIG. 2, and includes an addition element. Identical components in each of the schematics shown in FIGS. 2 and 3 have been labeled with the same identification numbers for clarity purposes. Prior art line filter assembly 130 is capable of minimizing unwanted noise signals at low and mid-range frequencies. The addition of feedthrough capacitor 132 permits the extended frequency range over line filter assembly 100.

Feedthrough capacitor is electrically coupled between primary filter sub-section 134 and secondary filter sub-section 136. Primary filter sub-section 134 further includes capacitors 106, 110, and 112 and common mode inductor 108. Secondary filter sub-section 136 further includes capacitors 114 and 118 and common mode inductor 116. While primary filter sub-section 134 and secondary filter sub-section 136 are illustrated and described having specific components, such as capacitors and common mode inductors, it is understood by those in the art that any primary and secondary filter can be used without deviating from the present invention. Feedthrough capacitor 132 provides an essentially low parasitic inductance. Therefore, feedthrough capacitor 132 does not suffer from the negative consequences associated with the components of line filter assembly 100 previously described.

The physical geometry of capacitor 132 has the appearance of a washer or a discoid. Unwanted noise signals transmitted on power lines 102 and 104 are transmitted through the center hole of capacitor 132, through physical attributes of capacitor 132, and out the outer diameter of capacitor 132, which is connected to earth ground. In some prior art line filter assemblies, capacitor 132 can have the physical appearance of a tube, rather than a washer. Unwanted noise signals are transmitted through the center of the tube, through the physical attributes of the tube, and out the outer diameter of the tube, which is connected to earth ground. Feedthrough capacitor 132 is fabricated using very high efficiency dielectrics. For example, feedthrough capacitor 132 may utilize dielectrics which offer a large amount of capacitance for a limited plate area.

In most prior art line filter assemblies, feedthrough capacitor 132 is formed from a ceramic-type material to optimize the dielectric value of the capacitor. However, a negative aspect of using a ceramic-type material for feedthrough capacitor 132 is that feedthrough capacitor 132 is very brittle and prone to mechanical breakage. Since feedthrough capacitor 132 must support connecting structures on either side, mechanical breakage of leads associated with feedthrough capacitor 132 is a common problem. Once feedthrough capacitor 132 cracks or breaks, it is unreliable. Additionally, an internal arc may develop which further renders feedthrough capacitor 132 unreliable. Also, feedthrough capacitor 132 is difficult to implement and represents excess product cost.

Figure 4:
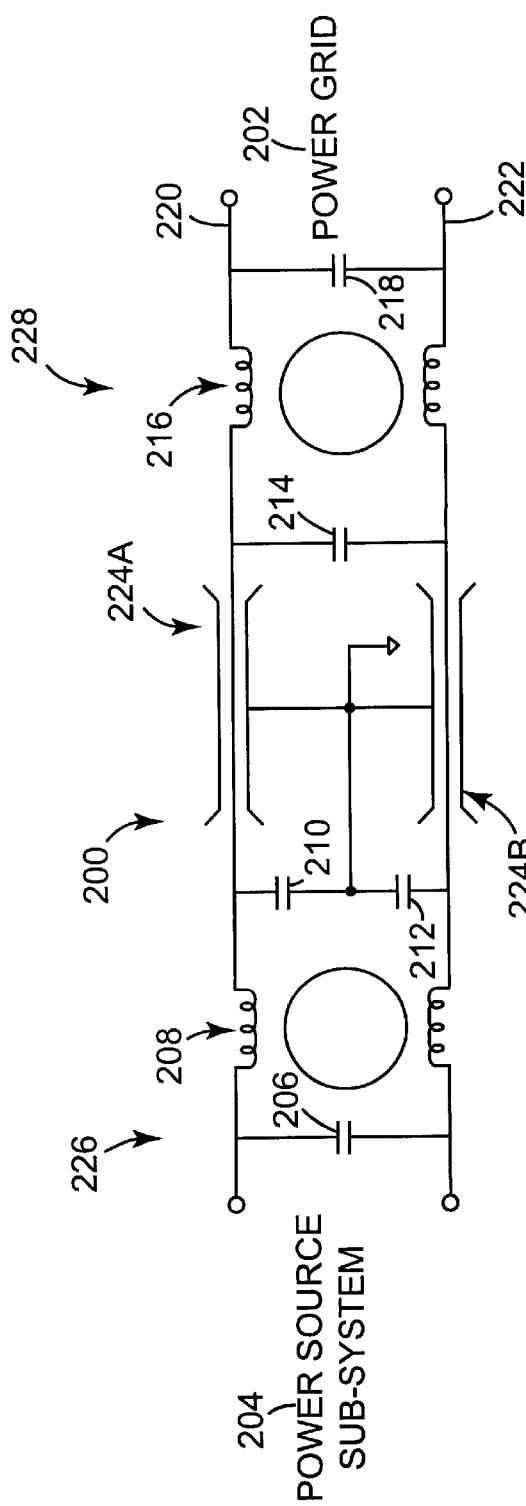
FIG. 4 is a schematic electrical representation of a circuit capable of minimizing unwanted emissions on a power cord in accordance with the present invention.

FIG. 4 is a schematic electrical representation of line filter assembly 200 capable of minimizing unwanted noise signals on a power cord in accordance with the present invention. Line filter assembly 200 minimizes noise signals between power source sub-system 204 and power grid 202 at low, mid, and high range frequencies, such as in the range of approximately 10 kilohertz to 5 gigahertz. Line filter assembly 200 includes primary filter sub-section 226 further comprising capacitor 206, common mode inductor 208, and capacitors 210 and 212. Line filter assembly 200 also includes capacitors 224A and 224B and secondary filter sub-section 228 further comprising capacitor 214, common mode inductor 216, and capacitor 218. Capacitors 206, 214, and 218 are commonly known as X-capacitors since they are connected between power lines 220 and 222. Capacitors 210 and 212 are commonly known as Y-capacitors since they are connected between a single power line, such as power line 220 or 222, and ground. Similar to the embodiment shown in FIG. 3, it is understood by those in the art that the specific electrical components (capacitors and inductors) included within primary filter sub-section 226 and secondary filter sub-section 228 are shown for illustrative purposes only. It is understood by those in the art that any type of filtering device or circuit may be used without deviating from the present invention.

As shown in FIG. 4, line filter assembly 200 includes all of the elements previously shown and discussed with reference to FIG. 2, with the addition of capacitors 224A and 224B, which are Y capacitors since they are connected between either power line 220 or 222 and ground. Capacitors 224A and 224B are shown as feedthrough type capacitors.

Primary filter sub-section 226 and secondary filter sub-section 228 of line filter assembly 200 provide a line filter assembly which minimizes unwanted conducted emissions at low frequencies, such as frequencies in the range of approximately 10 kilohertz up to 30 megahertz, as previously described with reference to FIG. 2. However, with the addition of capacitors 224A and 224B, line filter assembly 200 is capable of minimizing unwanted noise signals at frequencies in the range of approximately 10 kilohertz to 5 gigahertz. Capacitors 224A and 224B differ from capacitor 132 of FIG. 2 in that capacitor 132 is a standard, generic component having associated fixed limits. Conversely, capacitors 224A and 224B are components fabricated from various materials utilizing a unique design to provide low cost, high reliability and ease of implantation, while also providing noise attenuation at frequencies up to approximately 5 gigahertz. Capacitor 132 is not capable of operating at high range frequencies.

Figure 5:
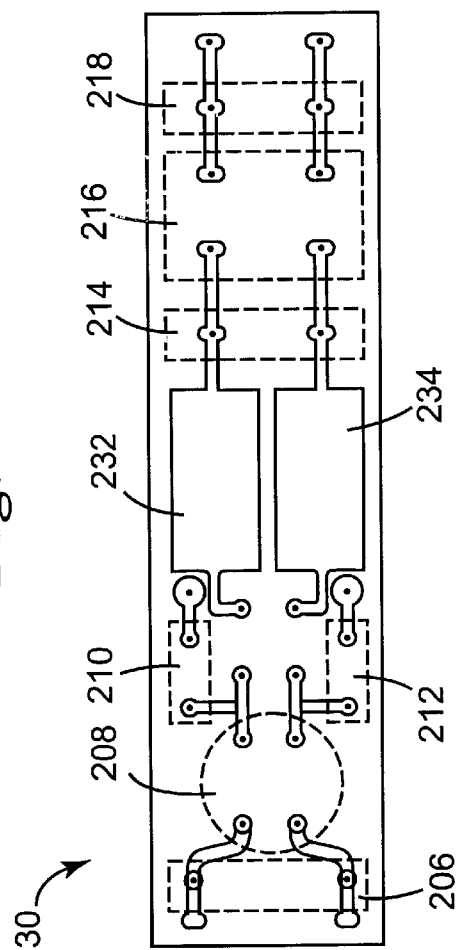
FIG. 5 is an illustration of a PC board structure corresponding to the electrical circuit shown in FIG. 4.

FIG. 5 is an illustration of PC board structure 230 which incorporates the embodiment of the present invention shown in FIG. 4. PC board structure 230 includes capacitor 206, common mode inductor 208, capacitors 210, 212, and 214, common mode inductor 216, capacitor 218, and copper plates 232 and 234. Thus, capacitors 224A and 224B, shown in FIG. 3, are fabricated as part of a PC board structure 230 and incorporate copper plates 232 and 234, respectively. Power line 220 is indirectly connected to copper plate 232, while power line 222 is indirectly connected to copper plate 234. At low frequencies, copper plates 232 and 234 do not have much of an effect on unwanted noise signals. However, at elevated frequencies, such as frequencies in the range of approximately 30 megahertz to 5 gigahertz, copper plates 232 and 234 provide an ever-increasing low impedance path to ground for unwanted noise signals.

It is desirous to provide a very low impedance path to ground for unwanted noise signals. Typically, the inductance of a conducting element, such as copper plates 232 and 234, is a function of the aspect ratio of the conducting element. If the conducting element has a geometry that is broad or represented by a square or rectangle, inductance tends to be low. Conversely, if the conducting element is long and spindly, such as piece of wire, inductance tends to be high. As is understood by those in the art, a conducting element, such as copper plates 232 or 234, having a broad or square geometry represents a series of parallel inductances. The sum of parallel inductances is a single inductance that is much lower of any one of the parallel inductances. Conversely, a conductive element having a long and spindly configuration, such as a wire, provides a series inductance which is much larger than any single section of the wire.

Figure 6:
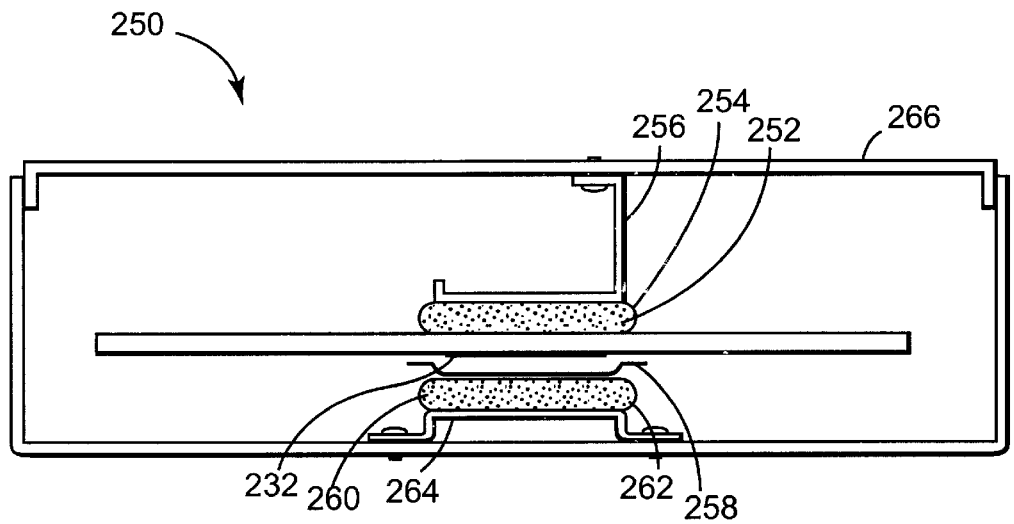
FIG. 6 is an enlarged, sectional view illustrating the mechanical configuration of a portion of the PC board structure connected to an enclosure in accordance with the present invention.
Figure 7:
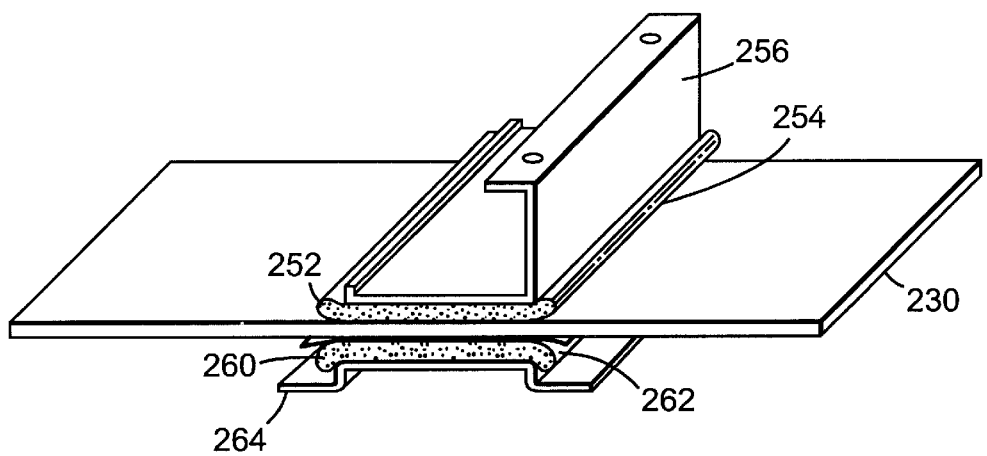
FIG. 7 is an enlarged, perspective view illustrating the mechanical structure shown in FIG. 6, wherein the enclosure has been removed for clarity purposes.

The interconnection between copper plates 232 and 234 and earth ground are shown in FIGS. 6 and 7. FIG. 6 is an enlarged, sectional view illustrating the mechanical configuration of a portion of PC board structure 230 connected to an enclosure in accordance with the present invention. While mechanical structure 250 is shown with reference to copper plate 232, it is understood that mechanical structure 250 is also used with reference to copper plate 234. In addition, it is understood that power line 220 is indirectly connected to copper plate 232, while power line 222 is indirectly connected to copper plate 234. FIG. 7 is an enlarged, perspective view illustrating the mechanical structure shown in FIG. 6, wherein the enclosure is removed for clarity purposes.

Mechanical structure 250 includes PC board 230, copper plate 232, foam pad 252 covered by electrically conducting material 254, conducting L-shaped brace 256, dielectric film 258, foam pad 260 covered by electrically conducting material 262, conducting brace 264, and enclosure 266. Mechanical structure 250 provides a feedthrough capacitor which is fabricated from several components, rather than a single component.

Mechanical structure 250, shown in FIGS. 6 and 7, incorporates two separate capacitors which provide a path for high-frequency noise signals radiating on a single power line to earth ground (enclosure 266). The first capacitor includes copper plate 232 and the combination of electrically conducting material 254 encompassing foam pad 252 and conducting L-shape brace 256 as the two parallel conducting elements separated by PC board 230, which acts as a dielectric. Power line 220 is indirectly connected to copper plate 232. In one preferred embodiment, foam pad 252 is a foam rubber pad, while PC board 230 is formed from a fiberglass composition and has a thickness in the range of approximately 0.03125 inches (1/32 inch) to 0.0625 inch (1/16 inch). With these dimensions, the capacitor formed by PC board 230, copper plate 232, and electrically conducting material 254 covering foam pad 252 has a capacitance in the range of approximately 5–25 picofarrads per square inch.

A second capacitor is formed by copper plate 232, electrically conducting material 262 covering foam pad 260 separated by dielectric film 258. In one embodiment, dielectric film 258 is a Mylar® film. Mylar® is a thin material and has a good dielectric constant, thereby providing a high capacitance. In addition, Mylar® is not prone to breakage and if an arc does occur through it, it is self-healing (thermoplastic). In one embodiment, dielectric film 258 has a thickness in the range of 500–1000 microinches. With these dimensions, the capacitor formed by copper plate 232 and electrically conducting material 262 covering foam pad 260 separated by dielectric film 258 has a capacitance in the range of approximately 25–100 picofarrads per square inch. Thus, in one embodiment, the combined capacitance of the two above-discussed capacitors shown in FIGS. 5 and 6 is in the range of approximately 30–125 picofarrads per square inch.

Foam pads 252 and 260 covered by electrically conducting material 254 and 262, respectively, provide the mechanical solution of connecting enclosure 266 with PC board structure 230 and dielectric film 258 in order to form efficient capacitors. As is known by those skilled in the art, capacitance of a capacitor is a direct function of the distance and spacing between capacitor plates. The elastromer properties of foam pads 252 and 260 provide both a mechanical and electrical solution to minimize the spacing between conductors. Without the use of foam pads 252 and 260, it would be necessary to position conducting braces 256 and 264, which are metal braces, adjacent to and in physical contact with PC board structure 230 and dielectric film 258, respectively. These interconnections would be unreliable without a fastening device, which would increase cost and be prone to mechanical breakage. Foam pads 252 and 260 provide an interface element which resolves this issue in a low cost and efficient manner.

As shown in FIG. 6, mechanical structure 250 includes two capacitors each utilizing copper plate 232 as one of the conductors. Both capacitors act as a feedthrough type capacitor which provide an electrical path to ground (enclosure 266) for unwanted noise signals radiating on power lines 220 at elevated frequencies. As previously discussed, at lower frequencies, the capacitors of mechanical structure 250 do not have much of an effect on noise signals.

As shown in FIG. 7, several elements of mechanical structure 250, such as foam pad 252 covered by electrically conducting material 254, conducting L-shaped brace 256, dielectric material 258, foam pad 260 covered by electrically conducting material 262, and conducting brace 264 have a width substantially equal to the width of PC board 230. Thus, these elements are shared elements which provide various structural components for capacitors associated with both copper plates 232 and 234. However, it is understood in the art that each of the above-referenced components may be separated into two distinct components and thereby associated with either copper plate 232 or 234 without deviating from the present invention.

Mechanical structure 250 provides a low pass line filter assembly capable of passing signals at 60 hertz so that power source sub-system 104 is properly powered and that unwanted high frequency noise signals are diverted to earth ground.

As previously discussed, at low frequencies, mechanical structure 250 does not have an overall effect upon noise signals transmitted between power source sub-system 104 and power grid 102. However, at elevated frequencies, such as frequencies above approximately 500 megahertz, mechanical structure 250 acts as a low pass filter permitting the transmission of desired signals between power grid 202 and power source sub-system 204, while minimizing unwanted noise signals from being transmitted between power source subsystem 204 and power grid 202.

As a further illustration, desired low frequency signals travel through leg 256A of conducting L-shape brace 256, which is an impedance-raising portion of conducting L-shape brace 256. Conversely, unwanted high-frequency signals, such as noise signals, will travel through leg portion 256B of conducting L-shape brace 256 and are shunted to earth (enclosure 266).

Figure 8:
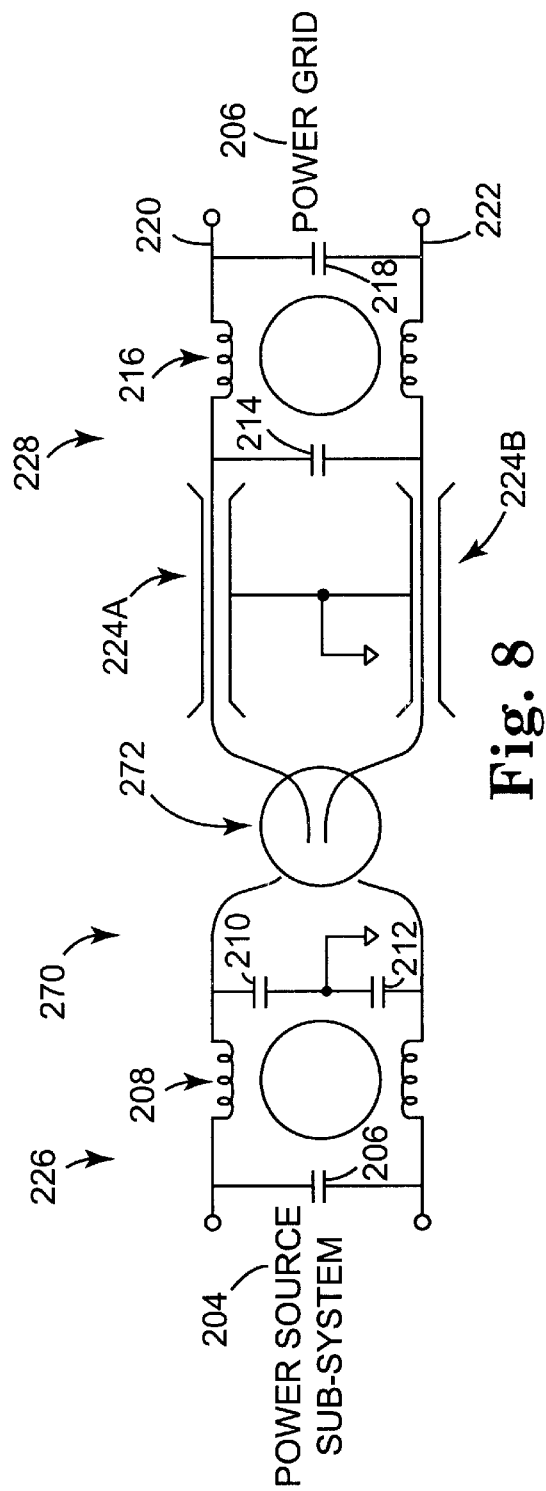
FIG. 8 is a schematic electrical representation illustrating another embodiment of the present invention.
Figure 9:
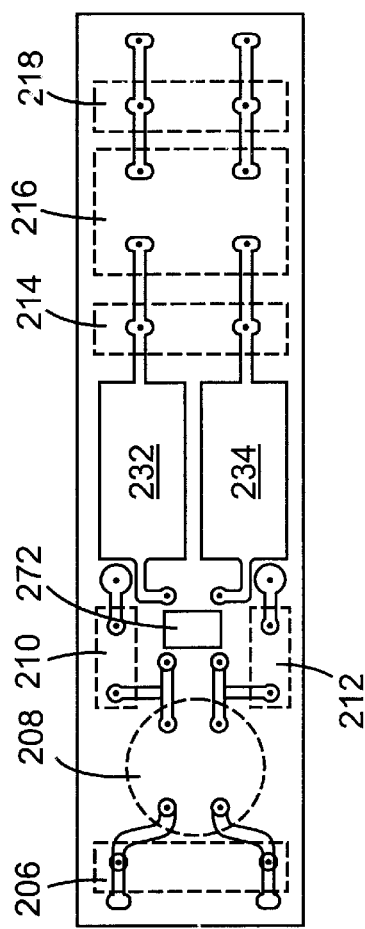
FIG. 9 is an illustration of a PC board structure corresponding to the electrical circuit shown in FIG. 8.

Depending upon the particular power source sub-system 202, the unwanted high frequency noise signals may not have a large enough impedance to be passed to ground using mechanical structure 250. Therefore, FIG. 8 is a schematic electrical representation illustrating another embodiment of the present invention addressing this issue, while FIG. 9 is an illustration of line filter assembly 270 in accordance with the present invention. Line filter assembly 270 includes high frequency common mode ferrite 272. As shown in FIG. 9, high frequency common mode ferrite 272 is used as a feedthrough type capacitor. Ferrite 272 is formed from a high frequency magnetic material. Ferrite 272 is electrically connected between primary filter sub-section 226 and copper plates 232 and 234 of capacitors 224A and 224B. Power lines 220 and 222 are simply feed through ferrite 274 in a common mode fashion on the load side of mechanical structure 250. Ferrite 274 raises the impedance of high frequency signals. The high-impedance, high frequency signals can then be efficiently bypassed to ground through mechanical structure 250 previously described. Therefore, ferrite 274 is a simply, inexpensive solution to the problem of unwanted high-frequency conducted emissions having low impedance.

Although specific embodiments have been illustrated and described herein for purposes of description of the preferred embodiment, it will be appreciated by those of ordinary skill in the art that a wide variety of alternate and/or equivalent implementations calculated to achieve the same purposes may be substituted for the specific embodiments shown and described without departing from the scope of the present invention. Those with skill in the chemical, mechanical, electromechanical, electrical, and computer arts will readily appreciate that the present invention may be implemented in a very wide variety of embodiments. This application is intended to cover any adaptations or variations of the preferred embodiments discussed herein. Therefore, it is manifestly intended that this invention be limited only by the claims and the equivalents thereof.

What is claimed is:

1. A line filter assembly for diverting unwanted emissions radiating on a power cord between a power source sub-system and a power grid to ground, the line filter assembly comprising:
   a PC board having first and second sides;
   a first pad covered with an electrically conducting material, the electrically conducting material positioned adjacent to the first side of the PC board;
   a first electrically conducting brace in electrical connection with the electrically conducting material covering the first pad and in electrical connection with an enclosure of the line filter assembly;
   first and second electrically conducting plates fabricated on the second side of the PC board, the first electrically conducting plate electrically connected to a first power line of the power cord, and the second electrically conducting plate electrically connected to a second power line of the power cord;
   a dielectric film positioned adjacent to the first and second electrically conducting plates;
   a second pad covered with an electrically conducting material, the electrically conducting material positioned adjacent to the dielectric film; and
   a second electrically conducting brace in electrical connection with the electrically conducting material covering the second pad and in electrical connection with the enclosure of the line filter assembly.

2. The line filter assembly of claim 1, and further comprising:
   a ferrite core electrically connected to the power cord, the ferrite core located between the power grid and the first and second electrically conducting plates.

3. The line filter assembly of claim 1, wherein the first pad further comprises a foam rubber pad.

4. The line filter assembly of claim 1, wherein the second pad further comprises a foam rubber pad.

5. The line filter assembly of claim 1, wherein the first electrically conducting brace further comprises a substantially L-shaped metal brace.

6. The line filter assembly of claim 1, wherein the first and second electrically conducting plates are each formed from a sheet of copper.

7. The line filter assembly of claim 1, wherein the dielectric film further comprises a Mylar® film.

8. The line filter assembly of claim 1, wherein the second electrically conducting brace further comprises a metal brace.

9. The line filter assembly of claim 1, wherein the PC board further comprises a PC board formed from fiberglass.

10. The line filter assembly of claim 1, wherein the PC board has a capacitance in the range of 5–25 picofarrads per square inch.

11. The line filter assembly of claim 1, wherein the dielectric film has a capacitance in the range of 25–100 picofarrads per square inch.

12. A system comprising:
   a power source sub-system;
   a power grid;
   a line filter assembly electrically connected between first and second power lines, the line filter assembly further comprising:
      a PC board having first and second sides;
      a first pad covered with an electrically conducting material, the electrically conducting material positioned adjacent to the first side of the PC board;
      a first electrically conducting brace in electrical connection with the electrically conducting material covering the first pad and in electrical connection with an enclosure of the line filter assembly;
      first and second electrically conducting plates fabricated on the second side of the PC board, the first electrically conducting plate electrically connected to the first power line of the power cord, and the second electrically conducting plate electrically connected to the second power line of the power cord;
      a dielectric film positioned adjacent to the first and second electrically conducting plates;
      a second pad covered with an electrically conducting material, the electrically conducting material positioned adjacent to the dielectric film; and
      a second electrically conducting brace in electrical connection with the electrically conducting material covering the second pad and in electrical connection with the enclosure of the line filter assembly.

13. The system of claim 12, and further comprising:
   a primary filter sub-section electrically connected between the power source sub-system and the line filter assembly; and
   a secondary filter sub-section electrically connected between the line filter assembly and the power grid.

14. The system of claim 13, and further comprising:
   a high frequency common mode ferrite electrically connected to the power cord, the high frequency common mode ferrite located between the primary filter sub-section and the first and second electrically conducting plates.

15. The system of claim 12, wherein the line filter assembly diverts emissions radiating on the first and second power lines at frequencies up to 5 gigahertz to the enclosure.

16. The system of claim 12, wherein the first pad further comprises a foam rubber pad.

17. The system of claim 12, wherein the second pad further comprises a foam rubber pad.

18. The system of claim 12, wherein the first electrically conducting brace further comprises a substantially L-shaped metal brace.

19. The system of claim 12, wherein the first and second electrically conducting plates are each formed from a sheet of copper.

20. The system of claim 12, wherein the dielectric film further comprises a Mylar® film.

21. The system of claim 12, wherein the second electrically conducting brace further comprises a metal brace.

22. The system of claim 12, wherein the PC board further comprises a PC board formed from fiberglass.

23. The system of claim 12, wherein the PC board has a capacitance in the range of 5–25 picofarrads per square inch.

24. The system of claim 12, wherein the dielectric film has a capacitance in the range of 25–100 picofarrads per square inch.

25. A line filter assembly for diverting unwanted emissions radiating on a power cord at frequencies greater than 30 megahertz between a power source sub-system and a power grid to ground, the line filter assembly comprising:

a first capacitor formed from an electrically conducting plate and a first electrically conducting material covering a first pad separated by a first dielectric film, the electrically conducting plate in electrical connection with the power cord; and a second capacitor formed from the electrically conducting plate and a second electrically conducting material covering a second pad separated by a second dielectric film.

26. The apparatus of claim 25, wherein the electrically conducting plate is a copper metal plate.

27. The apparatus of claim 25, wherein the first dielectric film is a PC board.

28. The apparatus of claim 25, wherein the second dielectric film is a Mylar® film.

29. The apparatus of claim 25, wherein the first and second electrically conducting materials are each connected to an enclosure.

30. A method diverting unwanted emissions radiating on a power cord between a power source sub-system and a power grid to ground, the method comprising:

electrically coupling the power cord to a first conductor;

diverting unwanted emissions radiating on the power cord at frequencies greater than 30 megahertz through a PC board separating the first conductor from a second conductor, the second conductor electrically coupled to ground; and diverting unwanted emissions radiating on the power cord at frequencies greater than 30 megahertz through a dielectric film separating the first conductor and a third conductor, the third conductor electrically coupled to ground.

31. A line filter assembly for diverting unwanted emissions including low frequency range emissions conducting on a power cord and high frequency range emissions radiating on the power cord between a power source sub-system and a power grid to ground, the line filter assembly comprising:

a first filter component electrically coupled to the power cord for filtering to ground the low frequency range conducted emissions; and a second filter component electrically coupled to the power cord for filtering to ground the high frequency range radiated emissions, wherein the high frequency range radiated emissions include emissions radiated at frequencies greater than 30 megahertz.

32. The line filter assembly of claim 31, wherein the first filter component filters low frequency range conducted emissions at frequencies in the range of approximately 10 kilohertz to approximately 30 megahertz.

33. A method of diverting unwanted emissions including low frequency range emission conducted on a power cord and high frequency range emissions radiating on the power cord between a power source sub-system and a power grid to ground, the method comprising:

filtering to ground the low frequency range unwanted emissions conducted on the power cord; and filtering to ground the high frequency range unwanted emissions radiating on the power cord, wherein the high frequency range unwanted emissions include emissions radiating at frequencies greater than 30 megahertz.

34. The method of claim 33, wherein the step of filtering to ground low frequency range unwanted emissions further comprises:

filtering to ground unwanted emissions conducting on the power cord at frequencies in the range of approximately 10 kilohertz to approximately 30 megahertz.

* * * * *